(12) United States Patent
Miller et al.

(10) Patent No.: US 11,837,623 B2
(45) Date of Patent: Dec. 5, 2023

(54) INTEGRATED CIRCUIT HAVING VERTICAL ROUTING TO BOND PADS

(71) Applicant: Raytheon Company, Waltham, MA (US)

(72) Inventors: Eric Miller, Lompoc, CA (US); Christian M. Boemler, Lompoc, CA (US); Justin Gordon Adams Wehner, Goleta, CA (US); Drew Fairbanks, Santa Barbara, CA (US); Sean P. Kilcoyne, Lompoc, CA (US)

(73) Assignee: Raytheon Company, Waltham, MA (US)

(*) Notice: Subject to any disclaimer, the term of this patent is extended or adjusted under 35 U.S.C. 154(b) by 345 days.

(21) Appl. No.: 17/068,223

(22) Filed: Oct. 12, 2020

(65) Prior Publication Data

US 2022/0115423 A1   Apr. 14, 2022

(51) Int. Cl.
| | | |
|---|---|---|
| *H01L 27/146* | (2006.01) | |
| *H01L 27/148* | (2006.01) | |
| *H01L 23/498* | (2006.01) | |
| *H01L 21/311* | (2006.01) | |
| *H01L 23/488* | (2006.01) | |
| *H01L 23/48* | (2006.01) | |
| *H01L 23/485* | (2006.01) | |
| *H04N 25/75* | (2023.01) | |

(52) U.S. Cl.
CPC ........ *H01L 27/1469* (2013.01); *H01L 21/311* (2013.01); *H01L 23/481* (2013.01); *H01L 23/485* (2013.01); *H01L 23/488* (2013.01); *H01L 23/49827* (2013.01); *H01L 27/148* (2013.01); *H01L 27/1462* (2013.01); *H01L 27/14632* (2013.01); *H01L 27/14634* (2013.01); *H01L 27/14636* (2013.01); *H01L 27/14685* (2013.01); *H04N 25/75* (2023.01)

(58) Field of Classification Search
CPC . H01L 27/146; H01L 27/148; H01L 27/1469; H01L 27/14634; H01L 27/14636; H01L 27/1462; H01L 27/14685; H01L 27/14632; H01L 21/311; H01L 23/48; H01L 23/498; H01L 23/485; H01L 23/481; H01L 23/488; H01L 23/49827; H01L 23/00; H01L 23/544; H01L 23/562
USPC ......................................................... 438/60
See application file for complete search history.

(56) References Cited

U.S. PATENT DOCUMENTS

| | | | | |
|---|---|---|---|---|
| 6,136,517 | A * | 10/2000 | Fletcher | G03F 7/70475 430/394 |
| 2003/0157748 | A1* | 8/2003 | Kim | H01L 21/76831 257/E21.705 |
| 2017/0062366 | A1 | 3/2017 | Enquist | |
| 2018/0033817 | A1* | 2/2018 | Ho | H01L 27/14634 |

(Continued)

*Primary Examiner* — Chuong A Luu
(74) *Attorney, Agent, or Firm* — DALY, CROWLEY, MOFFORD & DURKEE, LLP

(57) ABSTRACT

Methods and apparatus for an assembly having directly bonded first and second wafers where the assembly includes a backside surface and a front side surface. The first wafer includes IO signal connections vertically routed to the direct bonding interface by a first one of the bonding posts on the first wafer bonded to a first one of the bonding posts on the second wafer. The second wafer includes vertical routing of the IO signal connections from first one though the bonding posts on the second wafer to IO pads on a backside surface of the assembly.

8 Claims, 8 Drawing Sheets

(56) References Cited

U.S. PATENT DOCUMENTS

2018/0204798 A1     7/2018   Enquist et al.
2018/0330992 A1   11/2018   DeLaCruz et al.
2019/0123023 A1*   4/2019   Teig ........................ H01L 24/80

* cited by examiner

INTEGRATED CIRCUIT HAVING VERTICAL ROUTING TO BOND PADS

FIELD OF THE DISCLOSURE

The present disclosure relates to processing of integrated circuits, and more particularly, to direct bonding of circuits.

BACKGROUND

As is known in the art, integrated circuits have a number of layers, bond pads, and/or connections that require interconnection. Fabricating connections from one layer to another can be time consuming and costly. For example, conventional charge-coupled devices (CCDs) require a lengthy process to provide access to I/O pads after direct hybrid bonding (DBH) integration processing on a digital pixel visible imaging array. An aggressive etch chemistry is required to remove a thick oxide layer, such as SiO2, over aluminum I/O pads which results in a long processing time that may have post processing complications.

Wafer direct bonding is a technology that allows wafers to be bonded at room or low temperature without using any adhesive typically in a hermetic environment. Direct bonding may reduce mechanical stress and inhomogeneity as compared to adhesive bonding techniques. In addition, misfit dislocations in the layer and sliding or cracking of the bonded pairs during subsequent thermal processing steps can be avoided if the low temperature bonded wafer pairs can withstand a thinning process.

SUMMARY

Example embodiments of the disclosure provide methods and apparatus to route I/O pad signals though foundry layers using direct bonding, such as DBH, for allowing the I/O pads to be closer to the top layer of a DBH assembly, such as a visible imaging array. The use of direct bond hybridization (DBH) in conjunction with foundry metal layers enables the placement of vertical routing of I/O signal paths to any desired layer. In embodiments, this processing results in reductions in cycle time and process risk.

In one aspect, a method comprises: forming direct bonding posts on first and second wafers; depositing an oxide layer on a direct bonding side of the first and second wafers; directly bonding the first and second wafers at the direct bonding posts to form an assembly, wherein a direct bonding interface is formed at bonding surfaces of the first and second wafers, wherein the assembly comprises a backside surface and a front side surface, wherein the first wafer comprises IO signal connections vertically routed to the direct bonding interface by a first one of the bonding posts on the first wafer bonded to a first one of the bonding posts on the second wafer, wherein the second wafer comprises vertical routing of the IO signal connections from first one of the bonding posts on the second wafer to IO pads on a backside surface of the assembly.

A method can further include or more of the following features: vertical routing of the IO signal connections in the second wafer comprises vias from metal layer to metal layer, planarizing the oxide layers on first and second wafers, the IO pads on the backside layer are located on a metal layer in the second wafer closest to the backside surface of the assembly, the first wafer comprises a readout integrated circuit (ROIC) substrate, the second wafer comprises a charge coupled device (CCD) substrate, thinning the CCD substrate, applying at least one backside layer to the backside surface of the assembly, the at least one backside layer comprises an anti-reflective coating layer and a backside metal layer, etching material from the backside layer of the assembly to expose the IO pads on a backside surface of the assembly, the IO pads on the backside layer are located on a metal layer in the second wafer closest to the backside surface of the assembly, and/or making an external connection to the IO pads.

In another aspect, an assembly including first and second wafers directly bonded to each other comprises: direct bonding posts electrically connecting the first and second wafers; an oxide layer on direct bonding sides of the first and second wafers; and a direct bonding interface at bonding surfaces of the first and second wafers, wherein the assembly comprises a backside surface and a frontside surface, wherein the first wafer comprises IO signal connections vertically routed to the direct bonding interface by a first one of the bonding posts on the first wafer bonded to a first one of the bonding posts on the second wafer, wherein the second wafer comprises vertical routing of the IO signal connections from first one of the bonding posts on the second wafer to IO pads on a backside surface of the assembly.

An assembly can further include one or more of the following features: vertical routing of the IO signal connections in the second wafer comprises vias from metal layer to metal layer, the IO pads on the backside layer are located on a metal layer in the second wafer closest to the backside surface of the assembly, the first wafer comprises a readout integrated circuit (ROIC) substrate, and the second wafer comprises a charge coupled device (CCD) substrate, at least one backside layer comprising an anti-reflective coating layer and a backside metal layer, the IO pads on a backside surface of the assembly are exposed by etching material from the backside layer of the assembly, the IO pads on the backside layer are located on a metal layer in the second wafer closest to the backside surface of the assembly, and/or an external electrical connection to making an external connection to the IO pads.

BRIEF DESCRIPTION OF THE DRAWINGS

The foregoing features of this disclosure, as well as the disclosure itself, may be more fully understood from the following description of the drawings in which.

DETAILED DESCRIPTION

Figure 1:
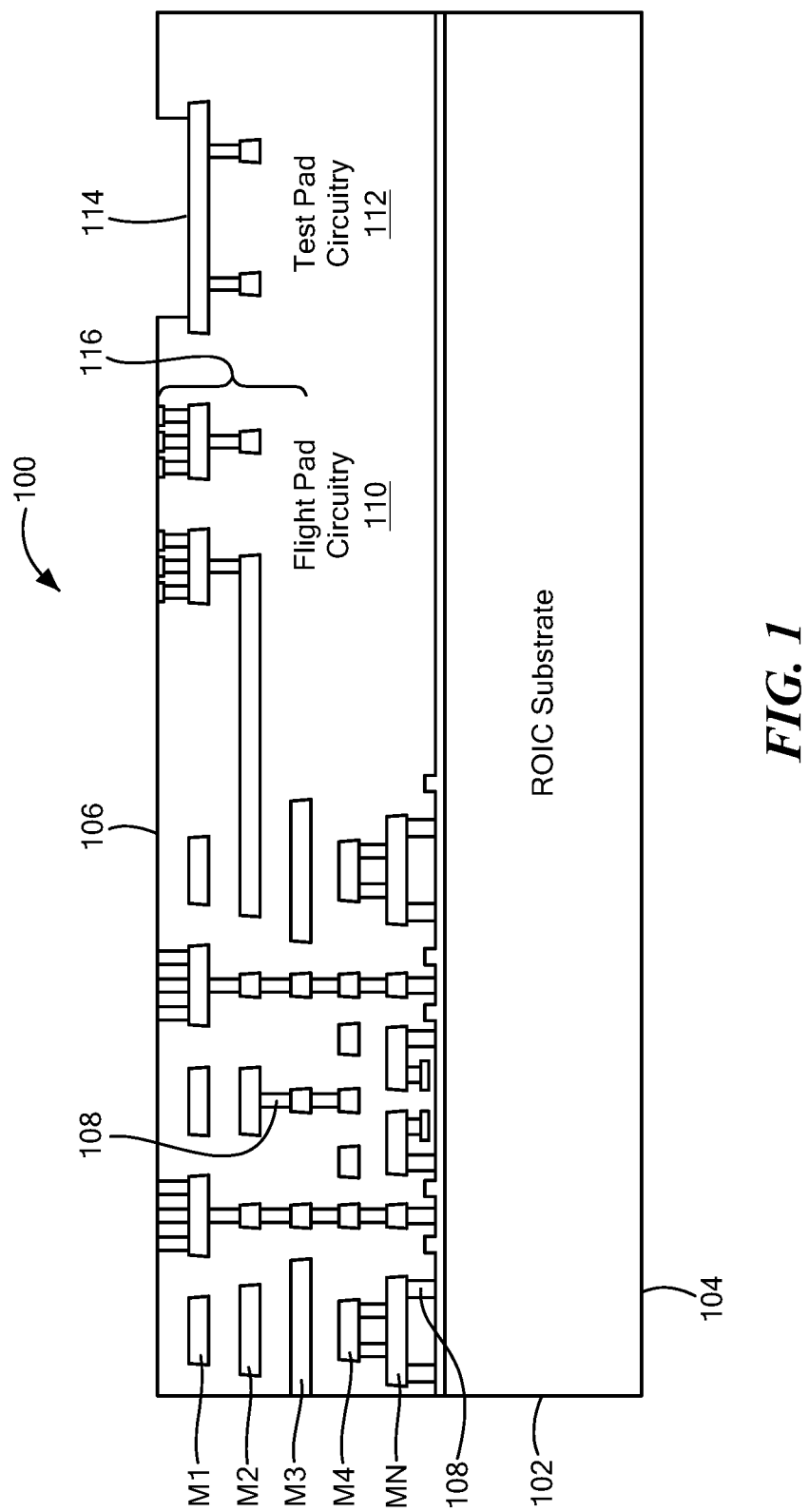
FIG. 1 is a cross-sectional view of a notional first wafer that vertical routing for direct bonding connection.

FIG. 1 shows a first wafer 100 that may comprise a readout integrated circuit (ROIC) substrate 102 for sensing applications, for example. The wafer 100 has a substrate side 104 and a bonding side 106. The wafer 100 may be received from a foundry, for example. The wafer 100 can include a series of metal layers M1-N separated by intermetallic dielectric layers (IMD). Vias 108 can connect the various metal layers. In the illustrated embodiment, the wafer 100 includes a flight pad circuit region 110 and a test pad circuit region 112. Probe pads 114 can be provided on top of the test pad circuit 112 so that a probe can be used to test the wafer.

The wafer 100 includes signal connections 116 from the flight pad circuit region 110 that are vertically routed to the bonding side 106 of the wafer. The flight pad is connected to main active circuitry that drives both power input to the chip as well read out analog/digital feedback signals chip. As described more fully below, the signal connections 116 are connected to a bonding post on the first wafer 100 that connects to a bonding post on a second wafer. The signal connections are vertically routed in the second wafer to a backside surface of an assembly comprising the first and second wafers. Bonding pads on the backside surface allow external connections without deep etches required by conventional processing.

Figure 2:
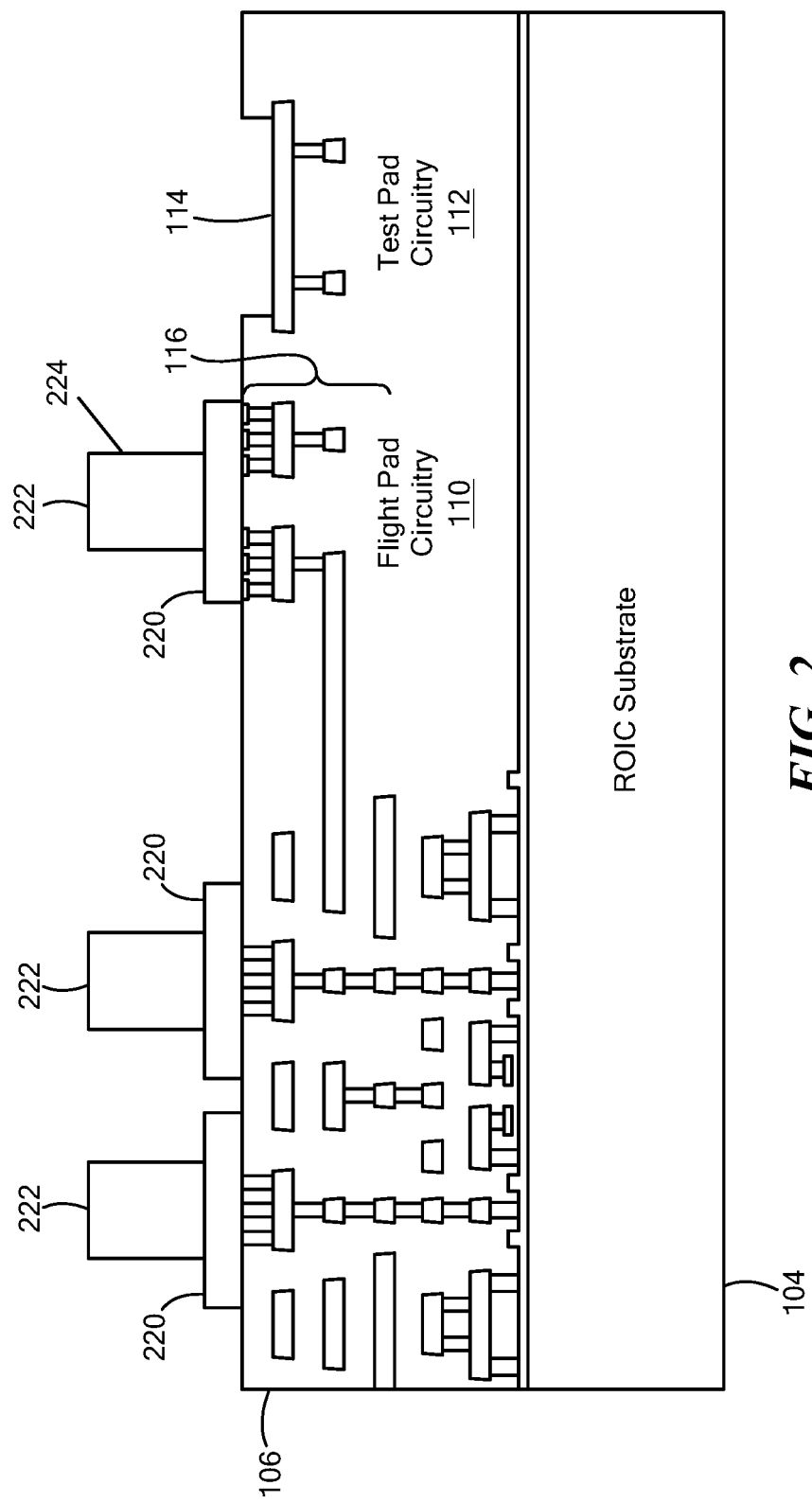
FIG. 2 is a cross-sectional view of the first wafer of FIG. 1 with direct bonding posts added.

FIG. 2 shows the wafer of FIG. 1 after deposition of plating base seed metal 220 on the top of the first wafer 100. Direct bonding posts 222 are formed on the plating base seed metal 220. In the illustrated embodiment, the plating base seed metal 220 is etched based on the locations of the direct bonding posts 222. Direct bonding posts 222 can comprise any suitable material, such as plate nickel.

A first one 224 of the bonding posts 222 includes vertical routing of the signal connections 116 from the flight pad circuit region 110. The vertical routing is comprised of both circuitry layered design built into both CCD and ROIC wafers. By DBH interconnecting both wafers together the two layer are integrated forming a vertical signal path from the ROIC to the CCD that can be taped into for full integration testing.

Figure 3:
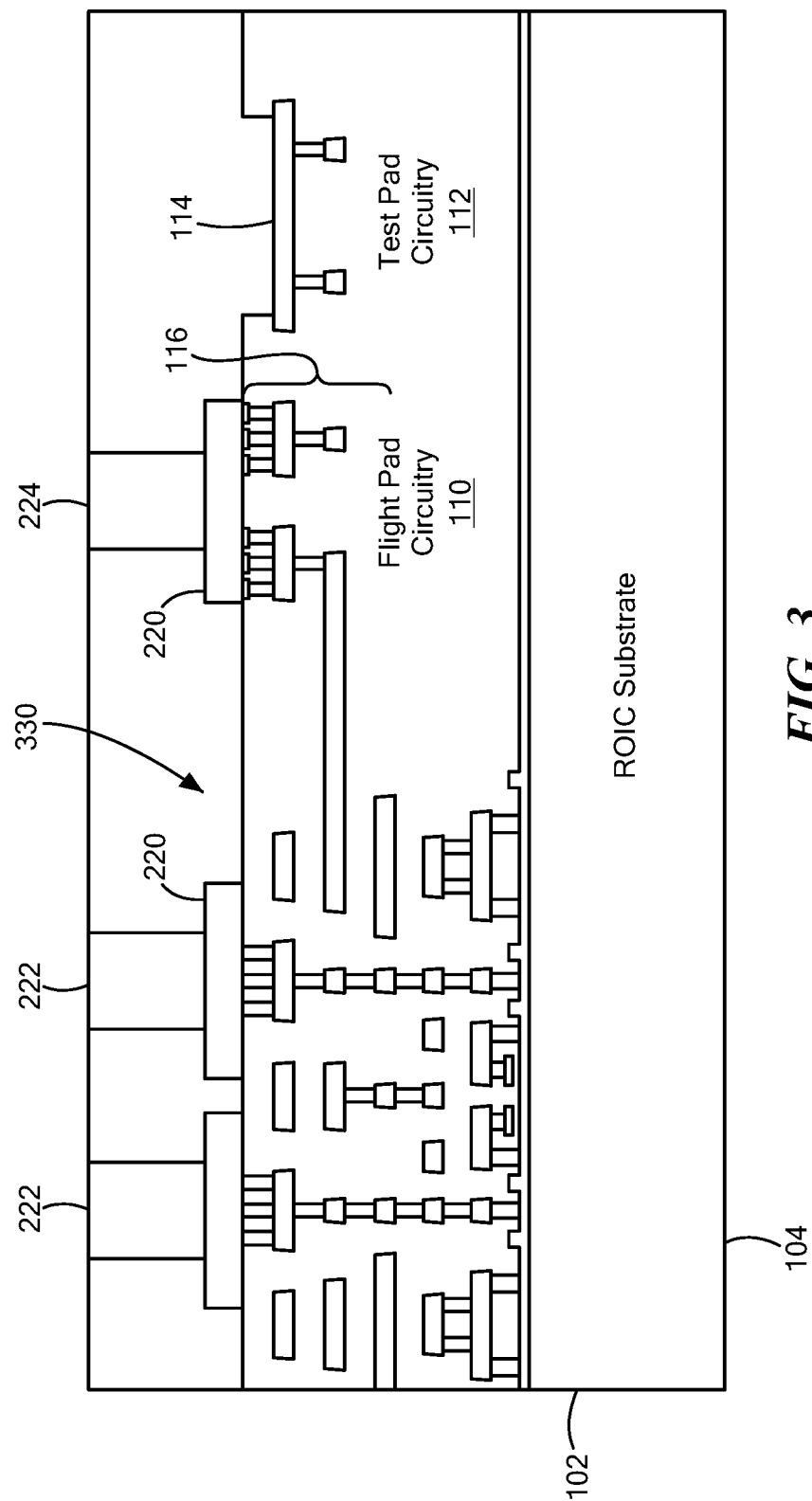
FIG. 3 is a cross-sectional view of the first wafer of FIG. 2 with bonding oxide added.

FIG. 3 shows the further addition of a bonding oxide 330 deposited on the top of the first wafer 100. In embodiments, the bonding oxide 330 can be planarized to reveal the direct bonding posts 222. The planarized surface of the wafer can be prepared for bonding.

Figure 4:
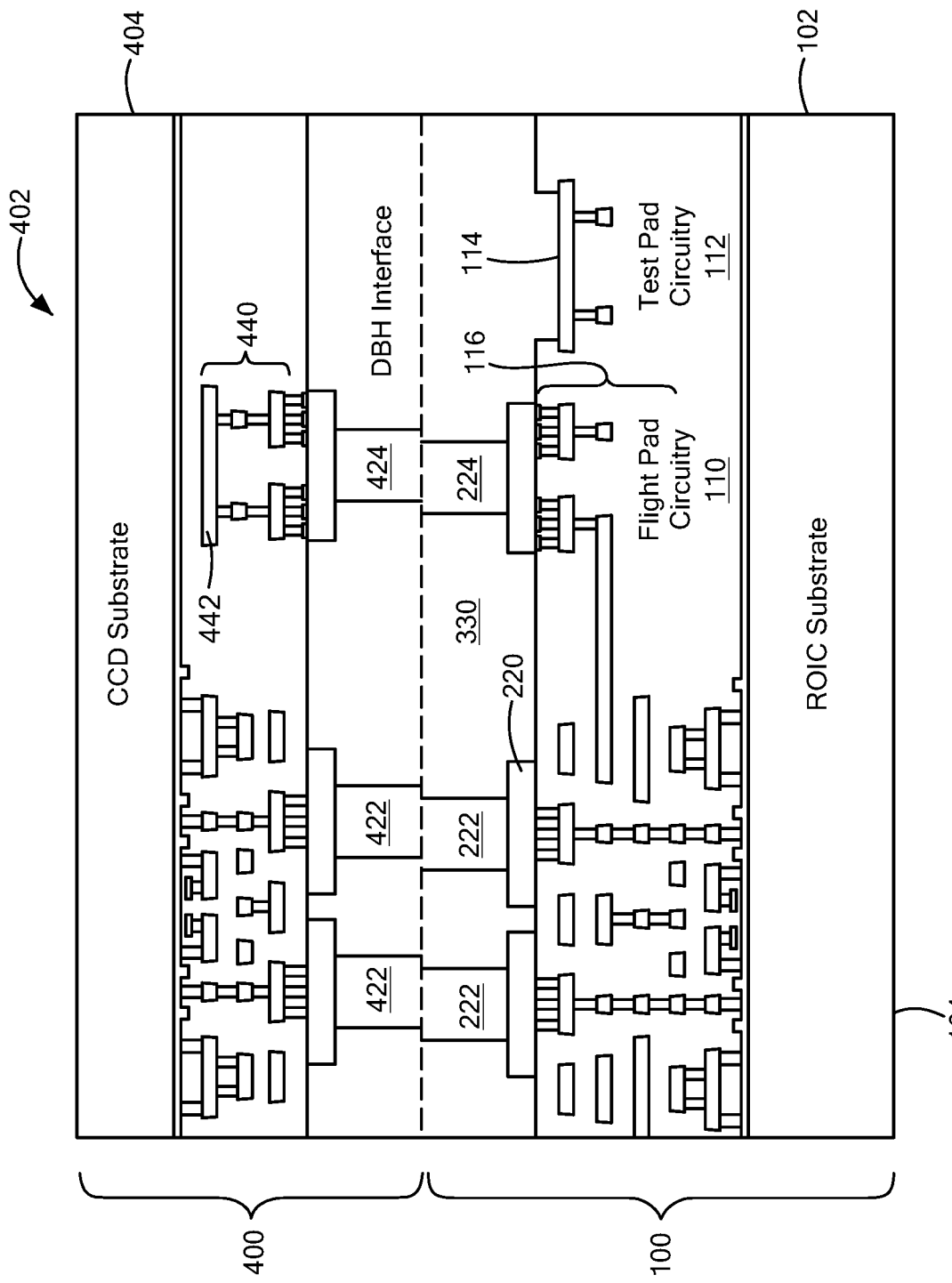
FIG. 4 is a cross-sectional view of the first wafer of FIG. 3 after direct bonding with a second wafer to form an assembly.

FIG. 4 shows a second wafer 400 direct bonded to the first wafer 100 to form an assembly 402. In embodiments, the second wafer 400, such as a charge coupled device (CCD) wafer having a CCD substrate 404, is prepared in a manner similar to the first wafer 100 to enable connection of the bonding posts 222. In embodiments, the assembly of the first and second wafers 100, 400 is annealed to force interconnection of the complementary DBH posts.

The second wafer 400 includes bonding posts 422 located to align with the bonding posts 222 on the first wafer 100. A first bonding post 424 on the second wafer is bonded to the bonding post 222 on the first wafer to continue vertical routing of the signal connections 116 from the flight pad circuitry 110 in the first wafer 100, e.g., the ROIC wafer. In embodiments, the vertical routing in the second wafer 400 includes connections 440 having vias that connect metal layers. In example embodiments, the vertical routing extends to a metal layer 442 in the second wafer 400 that is closest to the backside of the assembly.

Figure 5:
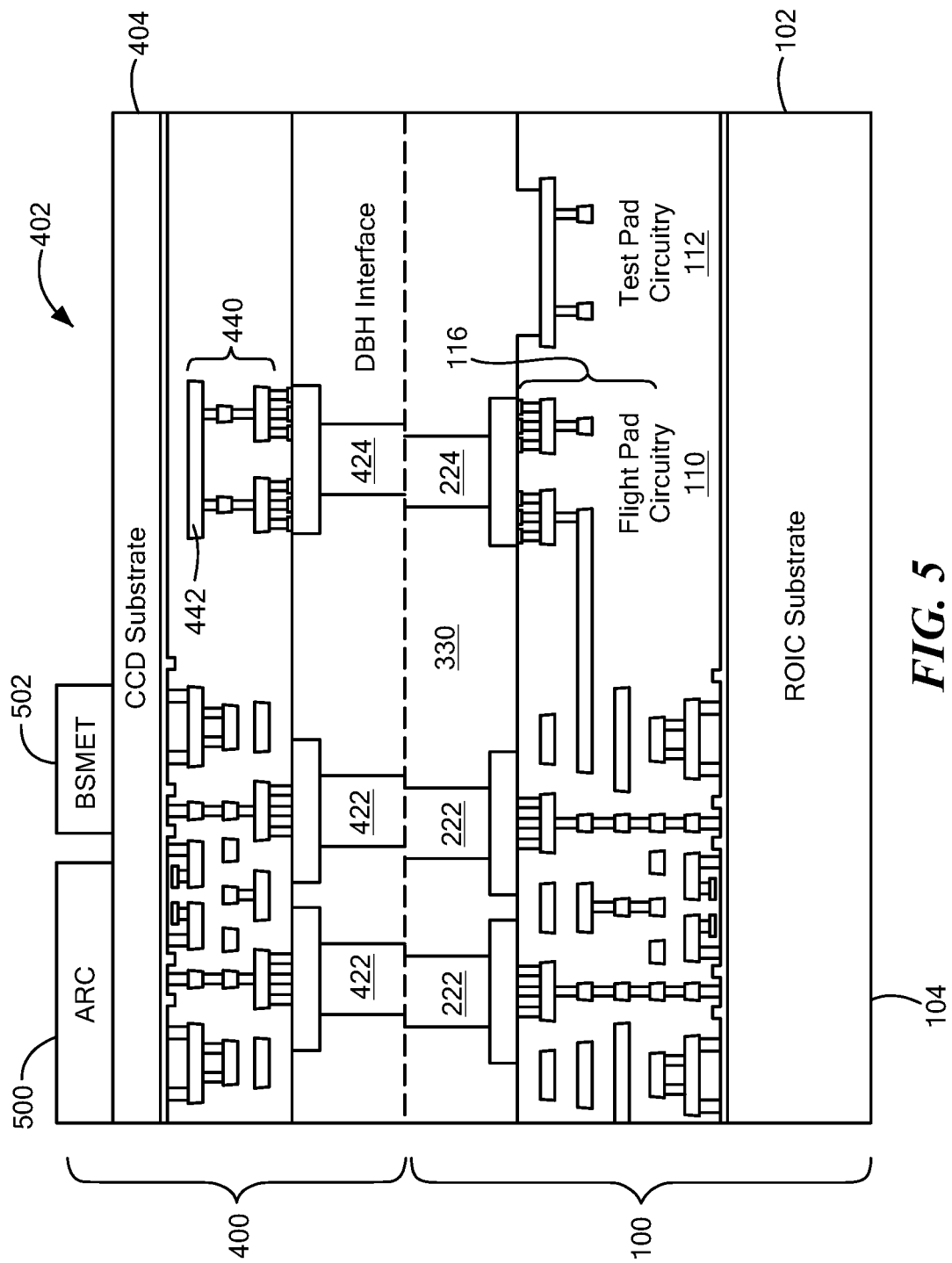
FIG. 5 is a cross-sectional view of the assembly of FIG. 4 with a substrate thinned and backside layers added.

FIG. 5 shows the assembly 402 of the first and second wafers 100, 400 after thinning of the CCD substrate 404. In the illustrated embodiment, an anti-reflectivity thin film coating (ARC) 500 and a backside metal layer (BSMET) 502 for electric field biasing are applied to support electro-optic/infrared (EO/IR) applications.

Figure 6:
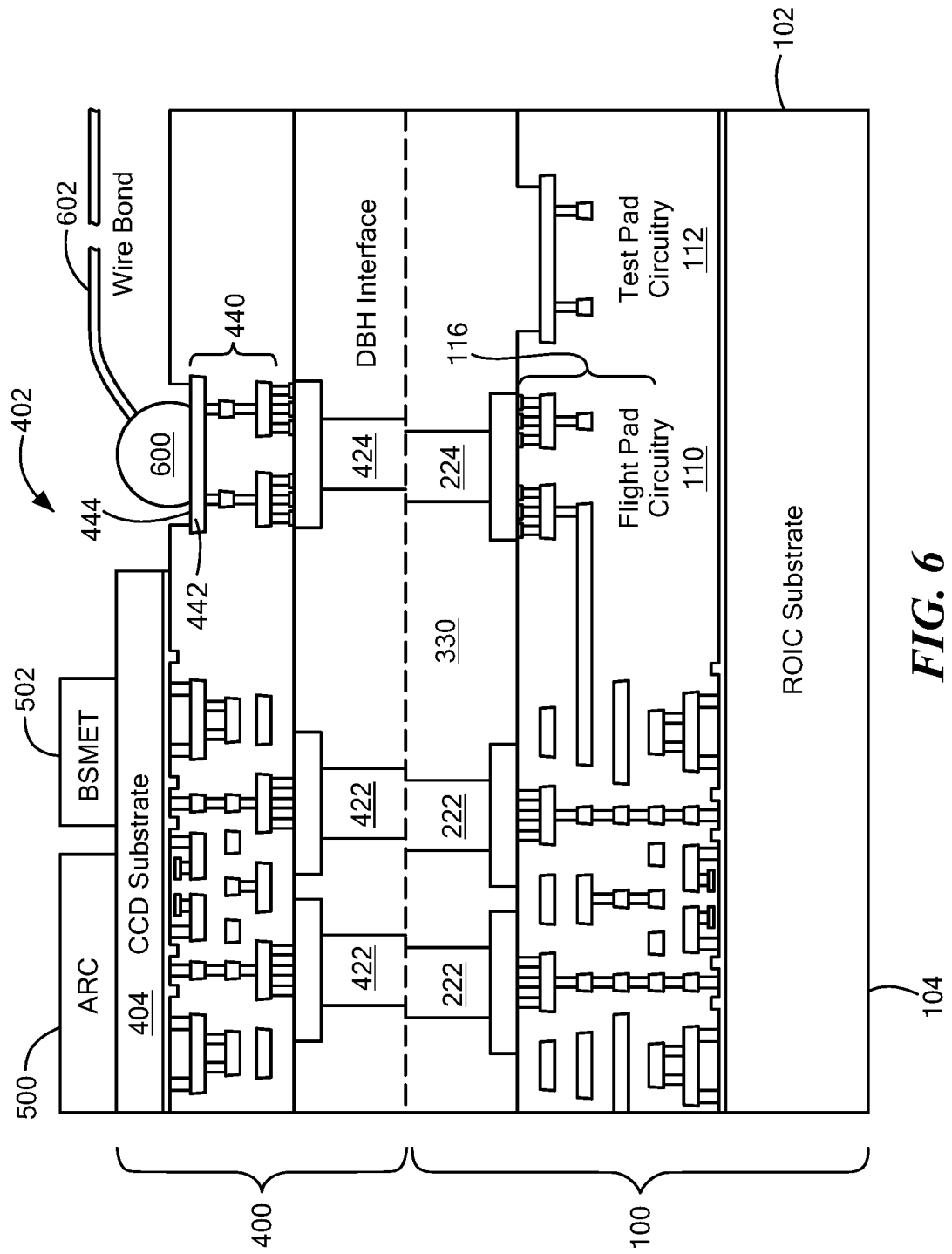
FIG. 6 is a cross-sectional view of the assembly of FIG. 6 after etching to expose bonding pads.
Figure 8:
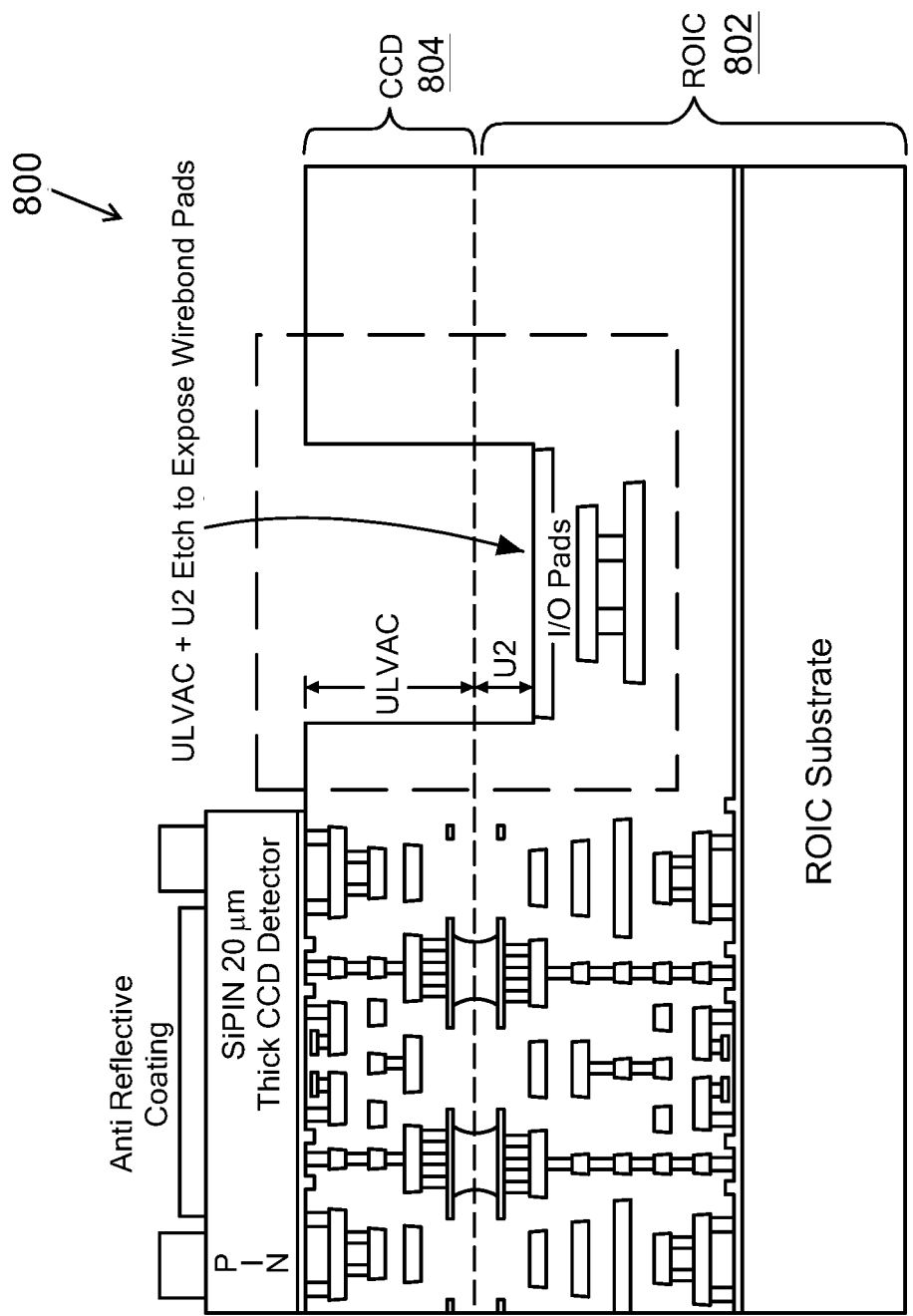
FIG. 8 is a cross-sectional view of a prior art DBH assembly with a deep etch to expose IO pads in the first wafer.

FIG. 6 shows the assembly after etching through a portion of the silicon of the CCD substrate 402 to expose a bond pad 444 on the backside-most metal layer 442. In embodiments, the etch is through the outer oxide layer to the first metal layer/bond pad 444. A connection 600, such as a wire bond or probe 602, can made to the bond pad 444 exposed by the etch to the first metal layer 442. The connection 600 to the vertical routing in the first and second wafers 100, 400 provides the IO signals from the flight pad circuitry 116 in the first wafer 100 by a quick etch instead of a long and deep etch through the second wafer 400 that is required in conventional processing, as shown in FIG. 8.

In the illustrated embodiment, the assembly includes the CCD substrate 404 provides a CCD detector connected to the ROIC 102. In one embodiment, the CCD substrate 404 is thinned to about 20 micrometers.

In embodiments, the wirebond pad 444 is in the order of 3 k Angstroms in foundry aluminum. At the direct bonded interface, via contacts can comprise tungsten. In embodiments, the first and second wafers can comprise similar contacts at the flight pad region.

Figure 7:
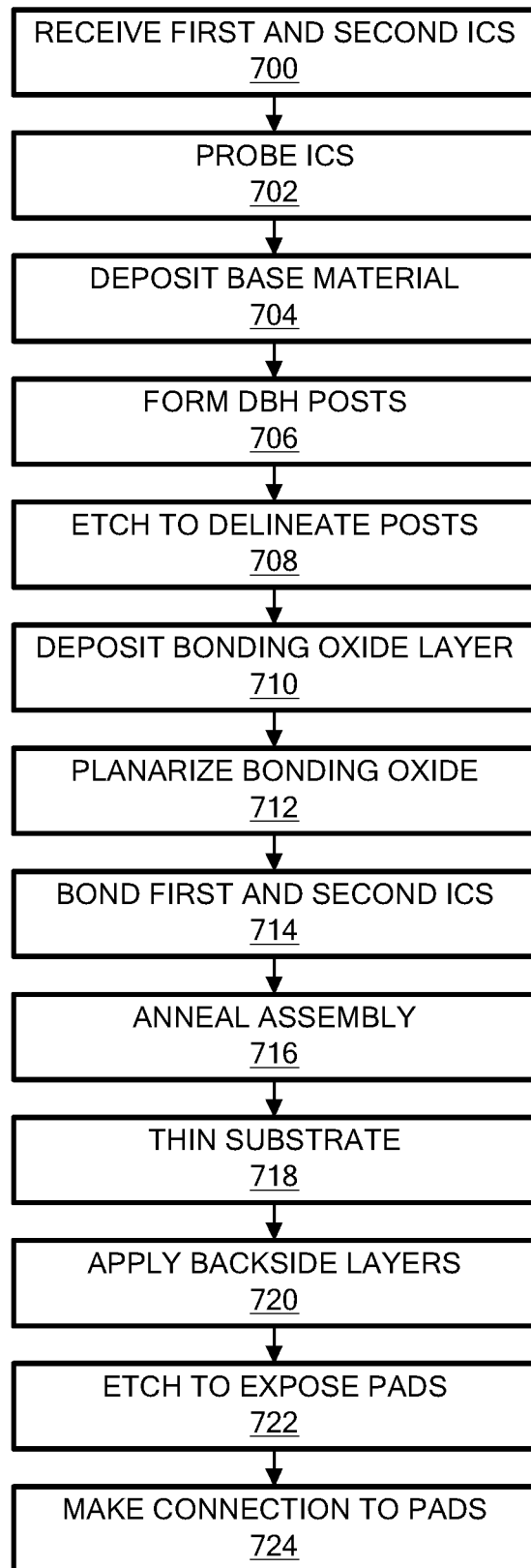
FIG. 7 is a flow diagram showing an example sequence of steps to provide the assembly of FIG. 6.

FIG. 7 shows an example sequence of steps for providing an integrated circuit having vertically routed IO bond pads using direct bonding, e.g., DBH processing. In step 700, a first IC, such as a ROIC, is received and step 702, a second IC, such as a CCD IC is received. In step 702, the first and second ICs are probed for yield information and prepared for DBH processing.

In step 704, a plating base seed material is deposited on a surface of first and second wafers. In step 706, DBH posts are formed on the first and second wafers at selected locations to enable bonding of the wafers. In embodiments, the DBH posts comprise plate nickel. In step 708, the base seed material is etched to delineate the DBH posts on the wafers.

In step 710, a bonding oxide layer is deposited on the first and second wafers over the surface on which the DBH posts were formed. In step 712, the bonding oxide is planarized to reveal the DBH posts. In step 714, the first and second wafers are bonded together at the DBH posts. In an example embodiment, the first wafer comprises a ROIC wafer and the second wafer comprises a CCD wafer. In step 716, the assembly of the first and second wafers is annealed to force an interconnect of the DBH posts.

In step 718, the second wafer substrate, e.g., a CCD substrate, is thinned to a specified thickness, such as about 20 μm. In step 720, backside layers can be applied, such as an anti-reflective thin film coating and backside metal for electrical field biasing. In step 722, a portion of the silicon CCD substrate is etched to remove foundry oxide and expose bonding pads, which may be located, for example, on a foundry metal 1 layer. In step 724, a connection, such as a wire bond, is made to the exposed bonding pads to enable functionality testing.

FIG. 8 shows a prior art DBH assembly 800 including a ROIC wafer 802 and a CCD wafer 804. Exposing IO pads in this assembly 800 requires a long and costly photo and etch process which required non-standard photo processing that increased process cycle times and reduces yields. As can be seen, a deep SiO2 etch is required that extends into the ROIC wafer to access the IO pads.

Various embodiments of the concepts systems and techniques are described herein with reference to the related drawings. Alternative embodiments can be devised without departing from the scope of the described concepts. It is noted that various connections and positional relationships (e.g., over, below, adjacent, etc.) are set forth between elements. These connections and/or positional relationships, unless specified otherwise, can be direct or indirect, and the present embodiments are not intended to be limiting in this respect. Accordingly, a coupling of entities can refer to either a direct or an indirect coupling, and a positional relationship between entities can be a direct or indirect positional relationship. As an example of an indirect positional relationship, references in the present description to element or structure "A" over element or structure "B" include situations in which one or more intermediate elements or structures (e.g., element "C") is between element "A" and element "B" regardless of whether the characteristics and functionalities of element "A" and element "B" are substantially changed by the intermediate element(s).

The following definitions and abbreviations are to be used for the interpretation of the claims and the specification.

As used herein, the terms "comprises," "comprising," "includes," "including," "has," "having," "contains" or "containing," or any other variation thereof, are intended to cover a non-exclusive inclusion. For example, a method, article, or apparatus that comprises a list of elements is not necessarily limited to only those elements but can include other elements not expressly listed or inherent to such method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment," "an embodiment," "an example embodiment," or variants of such phrases indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection knowledge of one skilled in the art to affect such feature, structure, or characteristic in connection with other embodiments whether or not explicitly described.

Furthermore, it should be appreciated that relative, directional or reference terms (e.g. such as "above," "below," "left," "right," "top," "bottom," "vertical," "horizontal," "front," "back," "rearward," "forward," etc.) and derivatives thereof are used only to promote clarity in the description of the figures. Such terms are not intended as, and should not be construed as, limiting. Such terms may simply be used to facilitate discussion of the drawings and may be used, where applicable, to promote clarity of description when dealing with relative relationships, particularly with respect to the illustrated embodiments. Such terms are not, however, intended to imply absolute relationships, positions, and/or orientations. For example, with respect to an object or structure, an "upper" surface can become a "lower" surface simply by turning the object over. Nevertheless, it is still the same surface and the object remains the same. Also, as used herein, "and/or" means "and" or "or", as well as "and" and "or." Moreover, all patent and non-patent literature cited herein is hereby incorporated by references in their entirety.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

What is claimed is:

1. An assembly including first and second wafers directly bonded to each other, comprising:
   direct bonding posts electrically connecting the first and second wafers;
   an oxide layer on direct bonding sides of the first and second wafers; and
   a direct bonding interface at bonding surfaces of the first and second wafers, wherein the assembly includes a backside surface and a frontside surface, the first wafer includes IO signal connections vertically routed to the direct bonding interface by a first one of the bonding posts on the first wafer bonded to a first one of the bonding posts on the second wafer, and the second wafer comprises vertical routing of the IO signal connections from first one of the bonding posts on the second wafer to IO pads on a backside surface of the assembly.

2. The assembly according to claim 1, wherein vertical routing of the IO signal connections in the second wafer comprises vias from metal layer to metal layer.

3. The assembly according to claim 1, wherein the IO pads on the backside layer are located on a metal layer in the second wafer closest to the backside surface of the assembly.

4. The assembly according to claim 1, wherein the first wafer includes a readout integrated circuit (ROIC) substrate, and the second wafer comprises a charge coupled device (CCD) substrate.

5. The assembly according to claim 4, further including at least one backside layer including an anti-reflective coating layer and a backside metal layer.

6. The assembly according to claim 1, wherein the IO pads on a backside surface of the assembly are exposed by etching material from the backside layer of the assembly.

7. The assembly according to claim 6, wherein the IO pads on the backside layer are located on a metal layer in the second wafer closest to the backside surface of the assembly.

8. The assembly according to claim 6, further including an external electrical connection to making an external connection to the IO pads.

* * * * *

UNITED STATES PATENT AND TRADEMARK OFFICE
CERTIFICATE OF CORRECTION

| | | |
|---|---|---|
| PATENT NO. | : 11,837,623 B2 | Page 1 of 1 |
| APPLICATION NO. | : 17/068223 | |
| DATED | : December 5, 2023 | |
| INVENTOR(S) | : Miller et al. | |

It is certified that error appears in the above-identified patent and that said Letters Patent is hereby corrected as shown below:

In the Specification

Column 1, Line 3, after the title, the following should be inserted as a new paragraph:
-- GOVERNMENT LICENSE RIGHTS
This invention was made with Government support under Contract No. HR0011-21-C-0134 awarded by the Defense Advanced Research Projects Agency (DARPA). The Government has certain rights in this invention. --

Signed and Sealed this
Sixth Day of May, 2025

Coke Morgan Stewart
*Acting Director of the United States Patent and Trademark Office*